United States Patent
McHugh et al.

(10) Patent No.: US 6,726,500 B1
(45) Date of Patent: Apr. 27, 2004

(54) LAND GRID ARRAY CONNECTOR ASSEMBLY WITH REINFORCEMENT

(75) Inventors: Robert G. McHugh, Golden, CO (US); Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/418,434

(22) Filed: Apr. 17, 2003

(51) Int. Cl.$^7$ .............................................. H01R 13/62
(52) U.S. Cl. ........................................ 439/331; 439/73
(58) Field of Search ................................ 439/330, 331, 439/73, 342, 71, 72, 526, 525

(56) References Cited

U.S. PATENT DOCUMENTS

| | | | | |
|---|---|---|---|---|
| 4,502,747 A | * | 3/1985 | Bright et al. | 439/296 |
| 5,302,853 A | * | 4/1994 | Volz et al. | 257/707 |
| 5,344,334 A | | 9/1994 | Laub et al. | |
| 6,086,387 A | * | 7/2000 | Gallagher et al. | 439/71 |
| 6,648,656 B1 | * | 11/2003 | Ma | 439/73 |
| 6,648,664 B1 | * | 11/2003 | McHugh et al. | 439/331 |

\* cited by examiner

*Primary Examiner*—Hien Vu
(74) *Attorney, Agent, or Firm*—Wei Te Chung

(57) ABSTRACT

An LGA connector assembly (1) includes an insulative base (11) receiving a plurality of contacts, a metal reinforcement (12) covering the base, and a lever (13) and a metal clip (14) respectively pivotally mounted on two opposite sides of the base. The base includes two opposite sidewalls (112), and each sidewall includes a pair of latches (116). The reinforcement includes a planar portion (121) and two elongate tabs (123) extending downwardly from two opposite lateral edges of the planar portion. Each tab includes a pair of windows (124) for engaging with the latches of the base. Thus, when the lever and the clip are rotated to tightly attach the CPU in the LGA connector assembly, the base is able to withstand the force from the clip without any deformation and warping.

2 Claims, 6 Drawing Sheets

LAND GRID ARRAY CONNECTOR ASSEMBLY WITH REINFORCEMENT

BACKGROUND OF THE INVENTION

1. Field of the Invention

The present invention relates to an electrical connector assembly for electrically connecting an electronic package such as a central processing unit (CPU) with a circuit substrate such as a printed circuit board (PCB), and particularly to a land grid array (LGA) connector assembly adapted for receiving a land grid array (LGA) CPU therein and electrically connecting the CPU with a PCB.

2. Description of the Prior Art

Referring to FIGS. 5 and 6, a conventional LGA connector assembly 9 is adapted for electrically connecting a CPU (not shown) having a plurality of metal pads with a PCB (not shown). The LGA connector assembly 9 comprises an insulative base 91, and a lever 92 and a metal clip 93 respectively pivotally mounted on two opposite sides of the base 91. The lever 92 comprises a pair of locating portions 921, an offset securing portion 922 between the locating portions 921, a medial portion 923 extending perpendicularly from an end of one of locating portions 921, and a handle portion 924 extending perpendicularly from a free end of the medial portion 923. The metal clip 93 defines a lip 931 at an end thereof, and a pair of mounting portions 932 extending arcuately from an opposite end thereof. The base 91 is substantially a rectangular plate. In a middle of the base 91, a general rectangular cavity 911 is defined for receiving the CPU therein. A portion of the base 91 under the cavity 911 defines a plurality of passageways (not shown) for receiving a corresponding number of contacts (not shown) therein. A pair of slots 912 is defined at one side of the base 91. The mounting portions 932 of the metal clip 93 are movably received in the slots 912, such that the metal clip 93 is pivotally mounted on the base 91. A trapezoidal recess 913 is defined in an opposite side of the base 91, and an elongate groove 914 is defined in the base 91 in communication with the recess 913. The locating portions 921 of the lever 92 are pivotably received in the groove 914, and the securing portion 922 of the lever 92 is received in the recess 913.

Referring to FIG. 6, in use, the base 91 is mounted on the PCB. The metal clip 93 is oriented perpendicularly to the base 91, and the medial portion 923 of the lever 92 is generally parallel to the metal clip 93. The CPU is mounted in the cavity 911, and the metal pads of the CPU are attached respectively on the contacts of the LGA connector assembly 9. Then the metal clip 93 is rotated downwardly to a horizontal position, such that the securing portion 922 of the lever 92 is located near to and higher than the lip 931 of the metal clip 93. The handle portion 924 of the lever 92 is rotated along with the medial portion 923, and the securing portion 922 is rotated downwardly to press on the lip 931. When the medial portion 923 is oriented at a horizontal position, the securing portion 922 of the lever 92 is attached tightly on the lip 931 of the metal clip 93, and the metal pads of the CPU are attached tightly on the contacts of the LGA connector assembly 9. The LGA connector assembly 9 thus electrically connects the CPU with the PCB.

At present, the sizes of LGA connector assemblies used in computers is steadily becoming smaller with the prevailing trend toward miniaturization of computers. In contrast, the number of contacts used in LGA connectors is increasing to meet the need for more signal transmission. These considerations bear on the conventional LGA connector assembly 9 as follows. During the rotation of the lever 92 to force the metal pads of the CPU on the contacts of the LGA connector assembly 9, the metal clip 93 forces upon the base 91 of the LGA connector assembly 9. The forces upon the portions of the base 91 near the slots 912 and at the elongate groove 914 is larger than those upon other portions of the base 91. Therefore the base 91 is liable to deform and warp. When deformation and warping occur, some contacts cannot firmly contact the metal pads of the CPU, which disrupts the electrical connection between the CPU and the PCB.

In view of the above, a new LGA connector assembly that overcomes the above-mentioned disadvantages is desired.

SUMMARY OF THE INVENTION

Accordingly, an object of the present invention is to provide an electrical connector assembly such as a land grid array (LGA) connector assembly for being reliable to electrically connecting an electronic package such as a land grid array (LGA) central processing unit (CPU) with a circuit substrate such as a printed circuit board (PCB), wherein the electrical connector assembly has a base without any deformation and warping.

To achieve the above-mentioned object, an LGA connector assembly in accordance with a preferred embodiment of the present invention comprises an insulative rectangular base receiving a plurality of electrical contacts, a metal reinforcement covering the base, and a lever and a metal clip respectively pivotally mounted on two opposite sides of the base. The base comprises two opposite sidewalls, and each sidewall comprises a pair of latches. The reinforcement comprises a planar portion parallel to the base, and two elongate tabs extending downwardly from two opposite lateral edges of the planar portion. Each tab defines a pair of windows each for engaging with the base in a corresponding latch. Thus, when the lever and the clip are rotated to tightly attach the CPU in the LGA connector assembly, the base is able to withstand the force from the metal clip without any deformation and warping.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
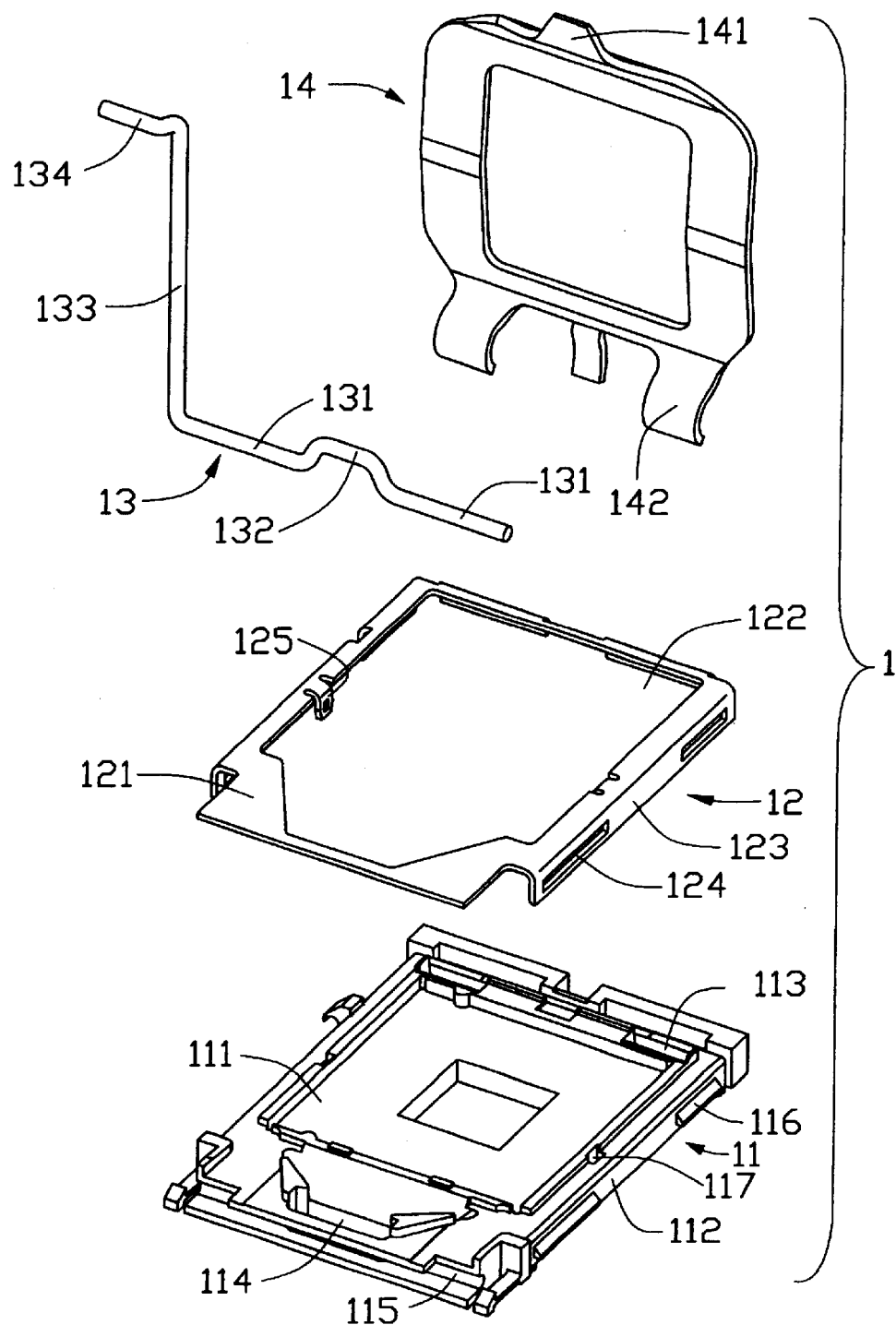
FIG. 1 is an exploded, isometric view of an LGA connector assembly of the present invention.

Referring to FIG. 1, an LGA connector assembly 1 in accordance with the preferred embodiment of the present invention is adapted for electrically connecting an electronic package such as a land grid array (LGA) central processing unit (CPU) (not shown) with a circuit substrate such as a printed circuit board (PCB) (not shown). The LGA connector assembly 1 comprises an insulative base 11, a plurality of contacts (not shown) received in the base 11, a rectangular metal reinforcement 12 covering the base 11, and a lever 13 and a metal clip 14 respectively pivotally mounted on two opposite sides of the base 11.

The lever 13 comprises a pair of locating portions 131, an offset securing portion 132 between the locating portions 131, a medial portion 133 extending perpendicularly from an end of one of the locating portions 131, and a handle portion 134 extending perpendicularly from a free end of the medial portion 133.

The clip 14 comprises a lip 141 at an end thereof, and a pair of mounting portions 142 extending arcuately from an opposite end thereof.

The reinforcement 12 is stamped and formed from a sheet of metallic material. The reinforcement 12 comprises a planar portion 121, and two elongate tabs 123 extending perpendicularly from opposite lateral edges of the planar portion 121. An opening 122 is defined in a middle of the planar portion 121. A pair of windows 124 is defined in each elongate tab 123. A pair of projecting members 125 extends downwardly from inner edges of the planar portion 121 respectively.

Figure 2:
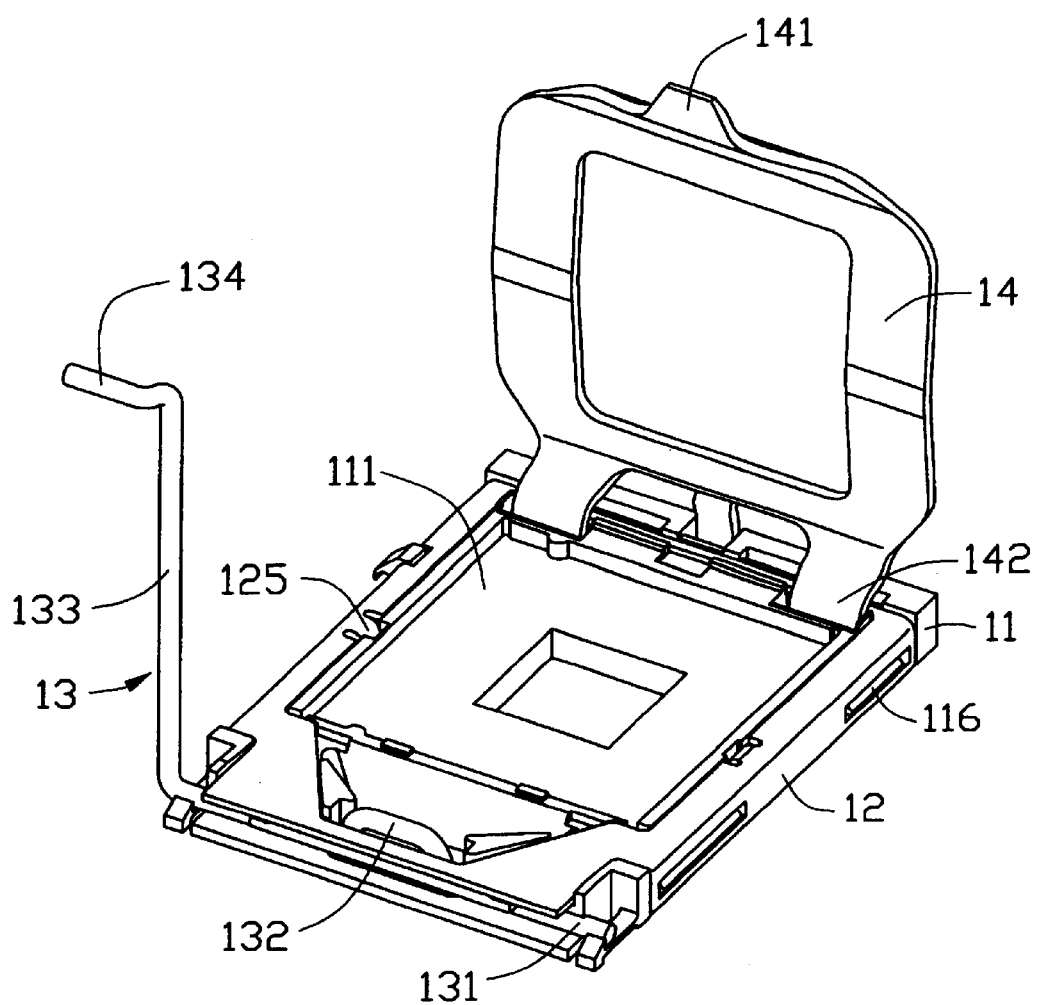
FIG. 2 is an assembled view of FIG. 1, showing a clip and a medial portion of a lever oriented perpendicularly to a base of the connector.
Figure 3:
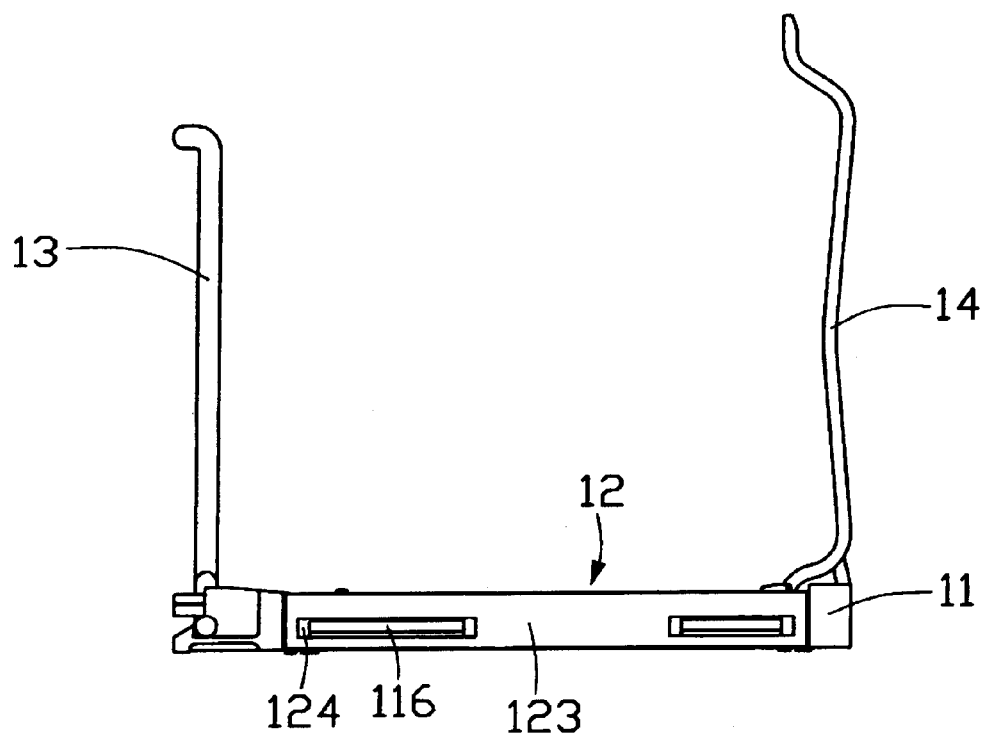
FIG. 3 is a side elevation view of FIG. 2, showing an extra space between an end of each of latches of the base and an inner edge of each of corresponding windows of a metal reinforcement engagingly receiving the latches.

Also referring to FIG. 2, the base 11 is generally rectangular. The base 11 comprises a rectangular cavity 111 in a middle thereof, corresponding to the opening 122 of the reinforcement 12. The cavity 111 and the opening 122 enable receipt of the CPU in the base 11 between two opposite sidewalls 112. A portion of the base 11 under the cavity 111 defines a plurality of passageways (not shown) for receiving a corresponding number of contacts (not shown) therein. The base 11 defines a pair of slots 113 in one side thereof, for receiving the mounting portions 142 of the clip 14 therein to pivotally mount the clip 14 on the base 11. The base 11 defines a trapezoidal recess 114 in an opposite side thereof, and an elongate groove 115 in communication with the recess 114. The locating portions 131 of the lever 13 are received in the groove 115, and the securing portion 132 is received in the recess 114. On each sidewall 112 of the base 11, the base 11 forms a pair of latches 116, corresponding to the windows 124 of the reinforcement 12. The latches 116 each have a triangular cross-section, thereby forming an engaging surface on a bottom thereof. Also referring to FIG. 3, the engaging surface of each latch 116 engages with the reinforcement 12 in a corresponding window 124 thereof. When the windows 124 engagingly receive the latches 116, the windows 124 and the latches 116 provide extra spaces between ends of the latches 116 and corresponding inner edges of the reinforcement 12 bounding the windows 124. The sidewalls 112 define a pair of holes 117 near opposite side extremities of the cavity 111 respectively, corresponding to the projecting members 125 of the reinforcement 12. The reinforcement 12 at the windows 124 engages respectively with the engaging surfaces of the latches 116. The projecting members 125 of the reinforcement 12 are fittingly received in the holes 117. The reinforcement 12 is thereby firmly mounted on the base 11.

Figure 4:
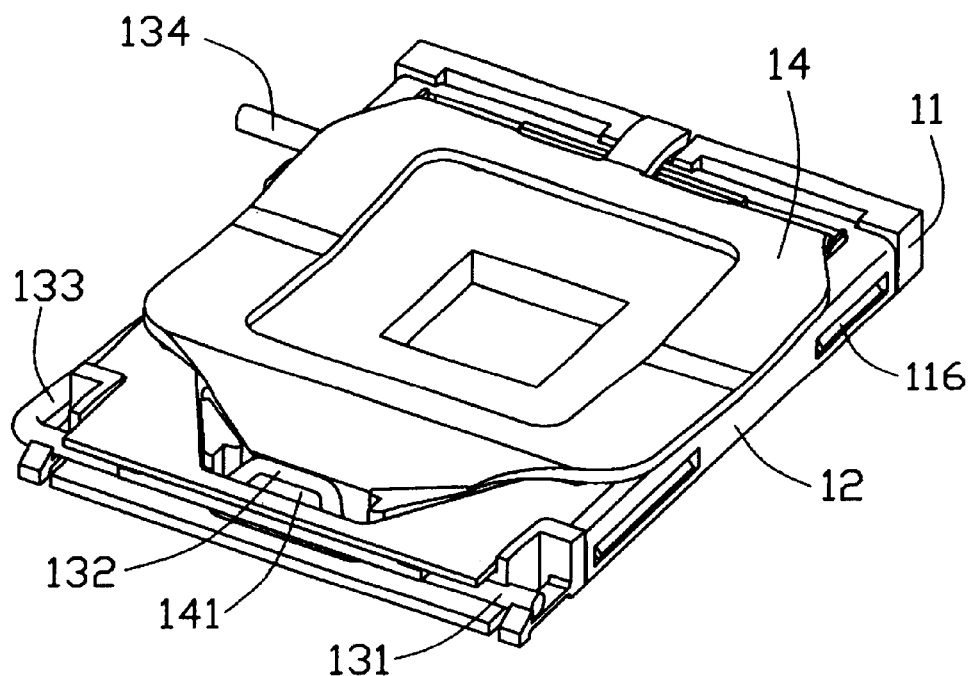
FIG. 4 is similar to FIG. 2, but showing the lever engaging with the clip.
Figure 5:
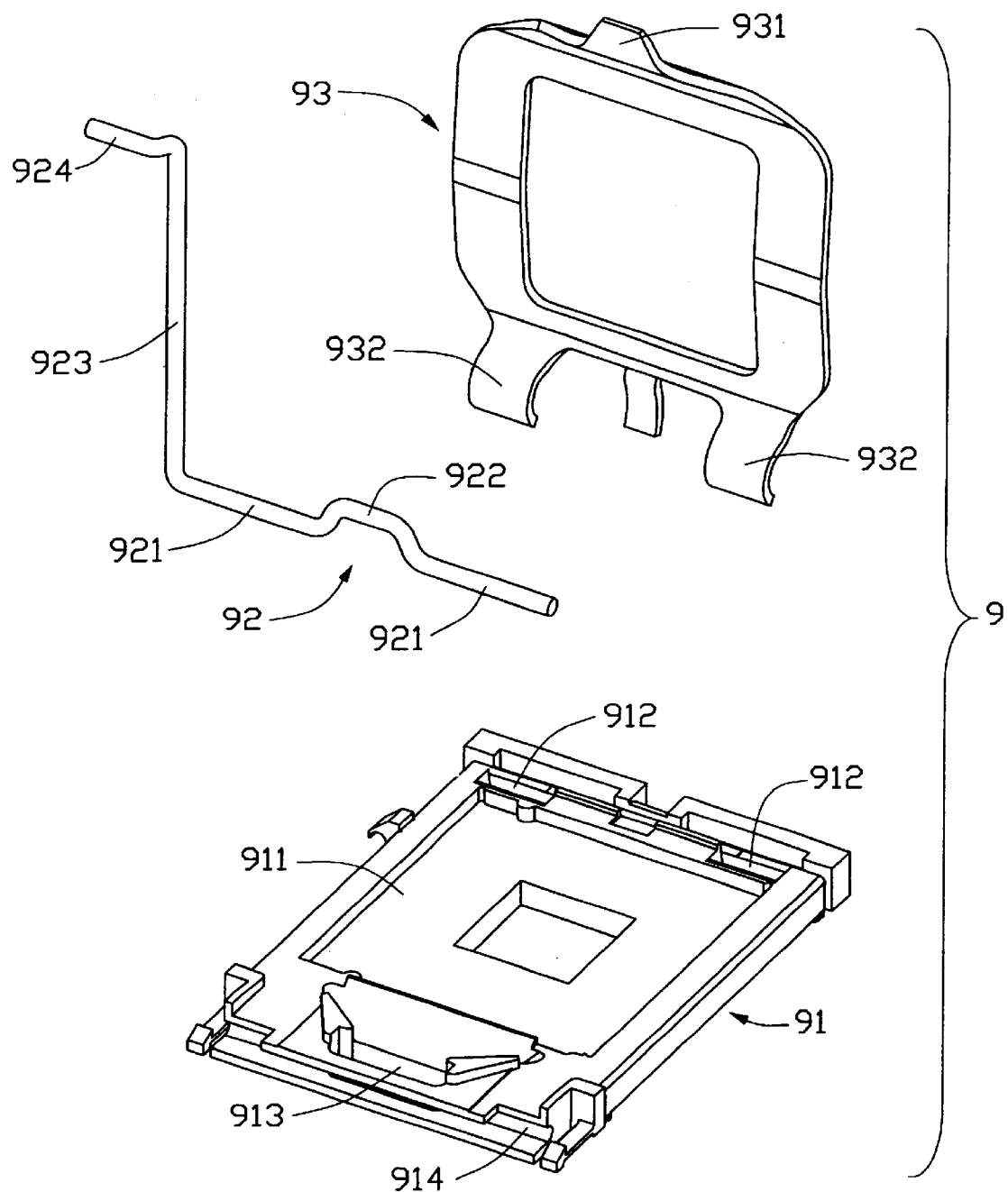
FIG. 5 is an exploded, isometric view of a conventional LGA connector assembly.
Figure 6:
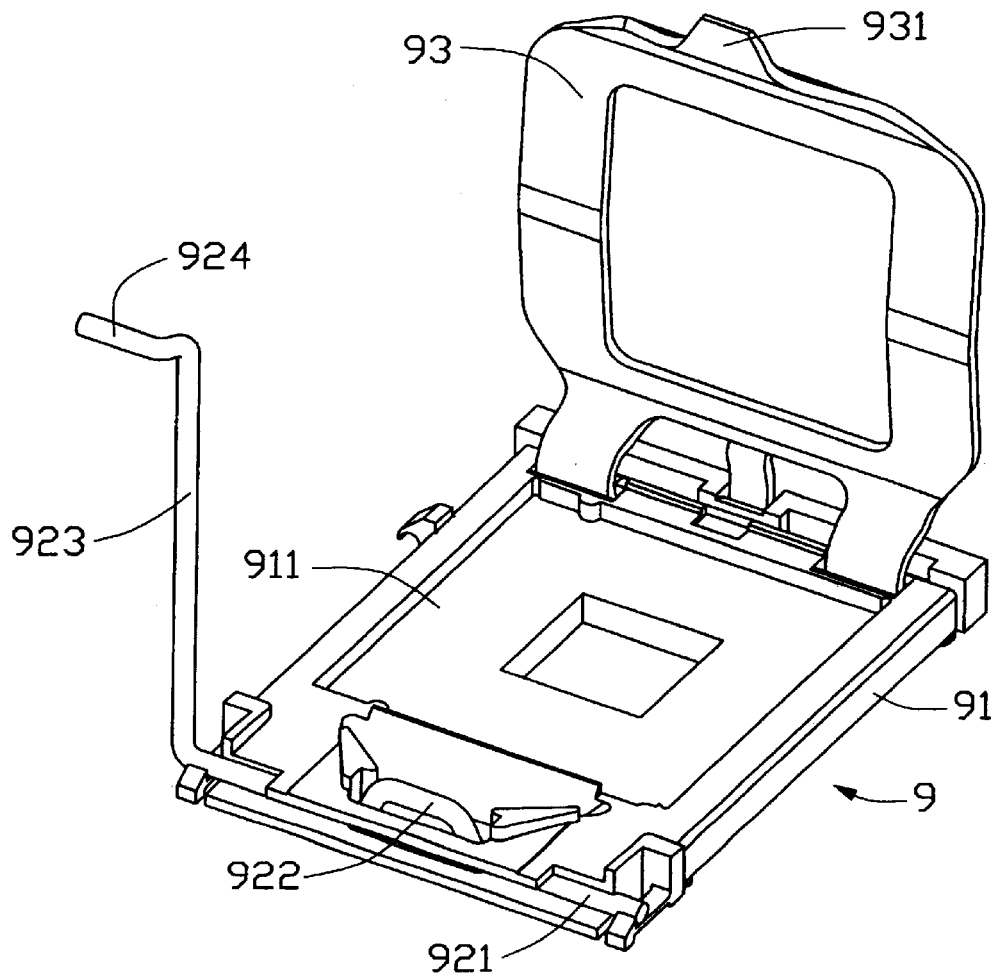
FIG. 6 is an assembled view of FIG. 5.

In use, the clip 14 and the medial portion 132 of the lever 13 are each oriented perpendicularly to the base 11. The CPU is mounted in the cavity 111, with metal pads (not shown) of the CPU attached on the contacts of the LGA connector assembly 1. The handle portion 133 of the lever 13 is rotated down, and the securing portion 132 is thereby rotated down to press on the lip 141 of the clip 14. Also referring to FIG. 4, when the medial portion 133 is parallel to the base 11, the securing portion 132 of the lever 13 tightly engages with the lip 141 of the clip 14, and the metal pads of the CPU are tightly attached on the contacts. As can be seen from FIGS. 2 and 3, the reinforcement 12 covers portions of the base 11 near the slots 113 and the groove 115. Thus, when the lever 13 and the clip 14 are rotated, even though the portions of the base 11 near to the slots 113 and the groove 115 sustain larger force than other portions of the base 11, the base 11 is able to withstand the force from the clip 14. As a result, the base 11 is unlikely to deform or warp. When the LGA connector assembly 1 is mounted on and electrically connected with a PCB, the LGA connector assembly 1 electrically connects the CPU with the PCB reliably.

In addition, when the LGA connector assembly 1 is heated in a soldering oven to electrically weld the contacts with the PCB, the reinforcement 12 and the base 11 are liable to expand. Because the material of the reinforcement 12 is metallic whereas the material of the base 11 is insulative, the reinforcement 12 expands more than the base 11. The reinforcement 12 covers over the base 11, and said extra spaces are provided between inner edges of the reinforcement 12 at the windows 124 and ends of the latches 116. Thus, when expansion of the reinforcement 12 and base 11 occurs, the latches 116 can slide within the windows 124. The reinforcement 12 is unlikely to deform even though the reinforcement 12 expands more than the base 11.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An LGA connector assembly, comprising
    an insulative base comprising two opposite sidewalls, each sidewall comprising at least one latch;
    a metal reinforcement covering the base, the reinforcement comprising a planar portion and a pair of elongate tabs extending perpendicularly from the planar portion, each tab defining at least one window for engaging with at least one latch of the base;
    a lever mounted pivotally on one side of the base, the lever comprising a securing portion;
    a clip mounted pivotally on an opposite side of the base, the clip comprising a lip at an end thereof for engaging with the securing portion and being positioned between the securing portion and the metal reinforcement; wherein
    there is a pair of latches on each sidewall, and a pair of windows on each tab; wherein
    each latch is triangular to form an engaging surface on a bottom thereof; wherein
    the reinforcement comprises two projecting members extending respectively downwardly from inner edges of the planar portion, and the base defines two holes corresponding to the projecting members for engaging with the projecting members.

2. The LGA connector assembly as claimed in claim 1, when the latches engage with the windows, an extra space is provided between an end of each latch and an inner edge of the reinforcement bounding a corresponding window.

* * * * *